United States Patent
Chang et al.

(10) Patent No.: US 10,502,776 B2
(45) Date of Patent: Dec. 10, 2019

(54) CIRCUIT BOARD TESTING SYSTEM

(71) Applicant: Primax Electronics Ltd., Neihu, Taipei (TW)

(72) Inventors: Pei-Ming Chang, Taipei (TW); Yang-Te Chung, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 111 days.

(21) Appl. No.: 15/951,742

(22) Filed: Apr. 12, 2018

(65) Prior Publication Data

US 2019/0187203 A1    Jun. 20, 2019

(30) Foreign Application Priority Data

Dec. 15, 2017 (TW) .............................. 106144227 A

(51) Int. Cl.
    *G01R 31/28* (2006.01)
    *G01R 31/30* (2006.01)
    *G01R 31/26* (2014.01)

(52) U.S. Cl.
    CPC ..... *G01R 31/2801* (2013.01); *G01R 31/3004* (2013.01); *G01R 31/2635* (2013.01)

(58) Field of Classification Search
    CPC ....... H01L 21/00; H01L 2221/00; G01R 1/00; G05F 1/00; H02J 1/00
    See application file for complete search history.

(56) References Cited

U.S. PATENT DOCUMENTS

| | | | |
|---|---|---|---|
| 2002/0130668 A1* | 9/2002 | Blades | G01R 1/07 324/536 |
| 2003/0065994 A1* | 4/2003 | Kang | G01R 31/30 714/708 |
| 2004/0152351 A1* | 8/2004 | Hwang | G01R 31/041 439/188 |
| 2005/0197797 A1* | 9/2005 | Dowland | G01R 31/2808 702/115 |
| 2017/0052217 A1* | 2/2017 | Zhang | G01R 31/385 |

* cited by examiner

*Primary Examiner* — Huy Q Phan
*Assistant Examiner* — Temilade S Rhodes-Vivour
(74) *Attorney, Agent, or Firm* — Muncy, Geissler, Olds & Lowe, P.C.

(57) ABSTRACT

A circuit board testing system includes a testing fixture. The testing fixture is used for testing plural wires of a cable of a circuit board. The testing fixture includes a first contact element, a switch circuit, a second contact element, a voltage acquisition element and a control unit. The first contact element is connected with input terminals of the plural wires. The second contact element is connected with output terminals of the plural wires. When the control unit drives a switching action of the switch circuit, a testing voltage is provided to the odd-numbered wires or the even-numbered wires. The control unit reads the voltage values of the odd-numbered wires and the voltage values of the even-numbered wires from the voltage acquisition element so as to judge whether the plural wires of the cable are normal.

16 Claims, 4 Drawing Sheets

CIRCUIT BOARD TESTING SYSTEM

FIELD OF THE INVENTION

The present invention relates to a testing system, and more particularly to a circuit board testing system for testing a circuit board of an electronic device.

BACKGROUND OF THE INVENTION

With the development of today's technology, various electronic devices such as desktop computers, notebook computers, tablet computers, personal digital assistants (PDA), smart phones, external hard drives, flash drives, printers, office machines, mouse devices, keyboard devices or video cameras have gradually become indispensable auxiliary tools in people's lives or work.

Generally, the functions of various electronic devices become more complicated, and the trends of designing the electronic devices are toward miniaturization. Correspondingly, the size of the flexible cable for transmitting electronic signals becomes smaller, and the gap between the electric contacts of the flexible cable is gradually decreased. During the process of fabricating the circuit board, it is necessary to test the electric contacts of the cable in order to realize whether the connection of the cable is accurate.

Conventionally, the wires of the cable are manually tested in a one-by-one manner. However, if the attention of the tester is not concentrated after the prolonged repetitive test, the erroneous test result is readily generated. Under this circumstance, the production yield of the circuit board is deteriorated. On the other hand, if the output value of the production line is increased, the testing process is labor-intensive and time-consuming. In other words, the fabricating cost is increased.

For solving the drawbacks of the conventional technologies, there is a need of providing a testing system for accurately and quickly testing whether the functions of the wires of a cable of a circuit board are normal.

SUMMARY OF THE INVENTION

The present invention provides a testing system for accurately and quickly testing whether the functions of the wires of a cable of a circuit board are normal.

In accordance with an aspect of the present invention, there is provided a circuit board testing system. The circuit board testing system includes a testing fixture. The testing fixture is connected with a circuit board for testing plural wires of a cable of the circuit board. The testing fixture includes a first contact element, a switch circuit, a second contact element, a voltage acquisition element and a control unit. The first contact element is connected with input terminals of odd-numbered wires of the plural wires and input terminals of even-numbered wires of the plural wires. The switch circuit is connected with the first contact element, and provides a testing voltage to the first contact element. The second contact element is connected with output terminals of the odd-numbered wires and output terminals of the even-numbered wires. The voltage acquisition element is connected with the second contact element, and acquires voltage values of the plural wires. The control unit is connected with the voltage acquisition element and the switch circuit, and reads the voltage values of the plural wires from the voltage acquisition element. When the control unit drives a switching action of the switch circuit, the testing voltage is provided to the odd-numbered wires or the even-numbered wires, and the control unit reads the voltage values of the odd-numbered wires and the voltage values of the even-numbered wires from the voltage acquisition element. The control unit judges whether functions of the plural wires of the cable are normal according to the voltage values of the odd-numbered wires and the voltage values of the even-numbered wires.

In an embodiment, the first contact element includes a first testing circuit and a second testing circuit, and the second contact element includes a third testing circuit and a fourth testing circuit.

In an embodiment, the first testing circuit is connected with the input terminals of the odd-numbered wires through plural first fixed resistors.

In an embodiment, the second testing circuit is connected with the input terminals of the even-numbered wires through plural third fixed resistors.

In an embodiment, the third testing circuit is connected with the output terminals of the odd-numbered wires through plural third fixed resistors and connected to a ground terminal through a first ground resistor.

In an embodiment, the fourth testing circuit is connected with the output terminals of the even-numbered wires through plural fourth fixed resistors and connected to a ground terminal through a second ground resistor.

In an embodiment, the odd-numbered wires are connected between the first testing circuit and the third first testing circuit in parallel.

In an embodiment, the voltage acquisition element includes a first analog input pin, and the first analog input pin is connected with the third testing circuit to acquire the voltage values of the odd-numbered wires.

In an embodiment, the even-numbered wires are connected between the second testing circuit and the fourth first testing circuit in parallel.

In an embodiment, the voltage acquisition element includes a second analog input pin, and the second analog input pin is connected with the fourth testing circuit to acquire the voltage values of the even-numbered wires.

In an embodiment, the switch circuit includes an optical relay and a single-pole-single-throw relay. The single-pole-single-throw relay is connected with the optical relay and includes a common terminal, a first normally closed terminal and a second normally closed terminal. The common terminal is connected with a DC power source. The DC power source provides the testing voltage. The first normally closed terminal is connected with the first testing circuit. The second normally closed terminal is connected with the second testing circuit.

In an embodiment, the control unit includes a digital output pin, and the digital output pin is connected with the optical relay to provide a start voltage to the optical relay. In response to the start voltage, the optical relay is enabled to drive the common terminal of the single-pole-single-throw relay to be connected with the first normally closed terminal or the second normally closed terminal.

In an embodiment, the testing fixture further includes a third contact element, and the third contact element is connected with plural LED elements of the circuit board.

In an embodiment, the third contact element is connected with plural third ground resistors. The plural LED elements are serially connected with the corresponding third ground resistors and connected with a ground terminal.

In an embodiment, the voltage acquisition element includes plural third analog input pins, and the plural third analog input pins are connected between the corresponding LED elements and the corresponding third ground resistors so as to acquire voltage values of the LED elements.

In an embodiment, the control unit reads the voltage values of the corresponding LED elements from the voltage acquisition element.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
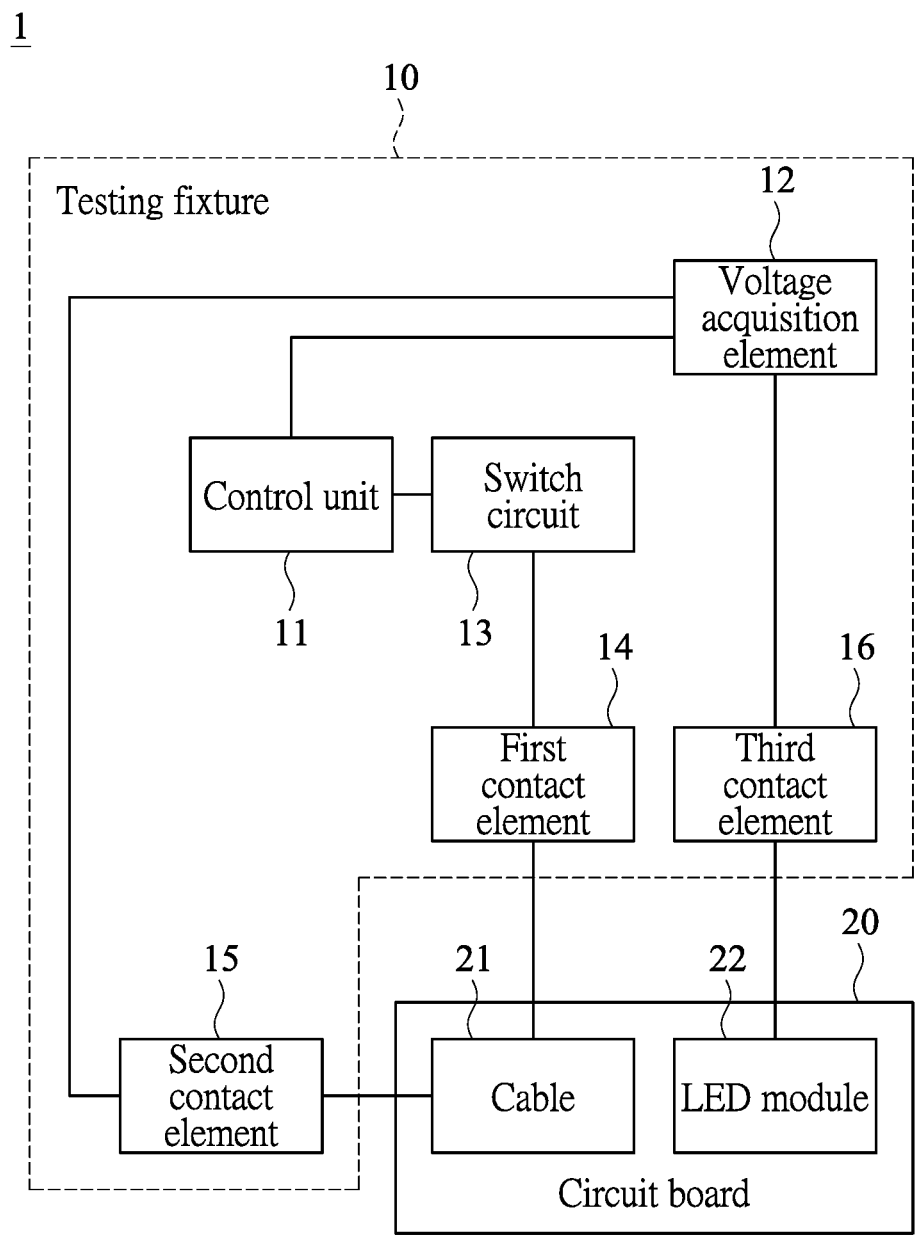
FIG. 1 is a schematic functional block diagram illustrating a circuit board testing system according to an embodiment of the present invention.

Please refer to FIG. 1. FIG. 1 is a schematic functional block diagram illustrating a circuit board testing system according to an embodiment of the present invention. The circuit board testing system 1 is used for testing a circuit board 20. The circuit board testing system 1 comprises a testing fixture 10. The testing fixture 10 is connected with an under-test circuit board 20. The testing fixture 10 is used for acquiring the voltage values of a cable 21 and a LED module 22 of the circuit board 20. According to these voltage values, the testing fixture 10 judges whether the functions of the cable 21 and the LED module 22 are normal.

Please refer to FIG. 1 again. The testing fixture 10 comprises a control unit 11, a voltage acquisition element 12, a switch circuit 13, a first contact element 14, a second contact element 15 and a third contact element 16. The control unit 11 is electrically connected with the voltage acquisition element 12 and the switch circuit 13. The switch circuit 13 is electrically connected with the first contact element 14. The first contact element 14 is contacted with an input terminal of the cable 21 of the circuit board 20. The voltage acquisition element 12 is electrically connected with the second contact element 15 and the third contact element 16. The second contact element 15 is contacted with an output terminal of the cable 21 of the circuit board 20. The third contact element 16 is contacted with the LED element of the LED module 22. The switch circuit 13 provides a testing voltage to the cable 21 of the circuit board 20 through the first contact element 14. The voltage acquisition element 12 acquires the voltage of the cable 21 through the second contact element 15. In addition, the voltage acquisition element 12 acquires the voltage of the LED module 22 through the third contact element 16. The control unit 11 reads the voltage value of the cable 21 and the voltage value of the LED module 22 from the voltage acquisition element 12, and judges whether the functions of the cable 21 and the LED module 22 are normal according to the voltage values. After the testing process is completed, the test results of the cable 21 and the LED module 22 are shown on a display module (not shown). Consequently, the tester can realize the test results of the cable 21 and the LED module 22 through the display module in real time. In an embodiment, the voltage acquisition element 12 is an analog-to-digital converter, the first contact element 14, the second contact element 15 and the third contact element 16 are contact probes, and the circuit board 20 is a printed circuit board (PCB).

Figure 2:
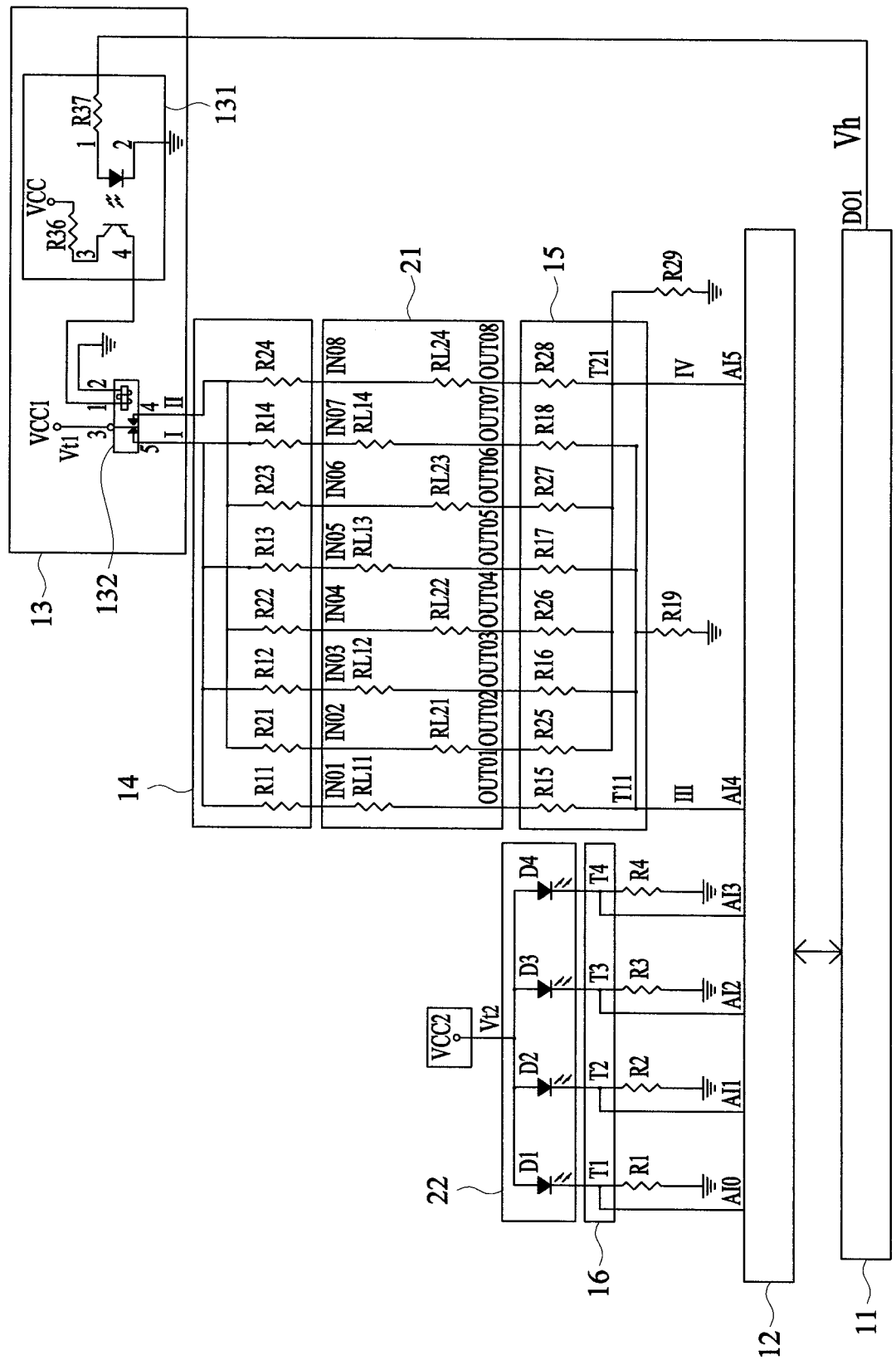
FIG. 2 is a schematic circuit diagram illustrating the circuit board testing system according to an embodiment of the present invention.

Please refer to FIG. 2. FIG. 2 is a schematic circuit diagram illustrating the circuit board testing system according to an embodiment of the present invention. As shown in FIG. 2, the cable 21 comprises plural odd-numbered wires RL11, RL12, RL13 and RL14 and plural even-numbered wires RL21, RL22, RL23 and RL24. The odd-numbered wires RL11, RL12, RL13 and RL14 comprise input terminals IN01, IN03, IN05 and IN07 and output terminals OUT01, OUT03, OUT05 and OUT07, respectively. The even-numbered wires RL21, RL22, RL23 and RL24 comprise input terminals IN02, IN04, IN06 and IN08 and output terminals OUT02, OUT04, OUT06 and OUT08, respectively.

The first contact element 14 comprises a first testing circuit I and a second testing circuit II. Moreover, the first contact element 14 comprises first fixed resistors R11, R12, R13 and R14 corresponding to the odd-numbered wires RL11, RL12, RL13 and RL14 and second fixed resistors R21, R22, R23 and R24 corresponding to the even-numbered wires RL21, RL22, RL23 and RL24. The first testing circuit I is connected with the input terminals IN01, IN03, IN05 and IN07 of the odd-numbered wires RL11, RL12, RL13 and RL14 through the first fixed resistors R11, R12, R13 and R14, respectively. The second testing circuit II is connected with the input terminals IN02, IN04, IN06 and IN08 of the even-numbered wires RL21, RL22, RL23 and RL24 through the second fixed resistors R21, R22, R23 and R24, respectively.

The second contact element 15 comprises a third testing circuit III and a fourth testing circuit IV. The second contact element 15 further comprises third fixed resistors R15, R16, R17 and R18 corresponding to the odd-numbered wires RL11, RL12, RL13 and RL14 and fourth fixed resistors R25, R26, R27 and R28 corresponding to the even-numbered wires RL21, RL22, RL23 and RL24. The third testing circuit III is connected with the output terminals OUT01, OUT03, OUT05 and OUT07 of the odd-numbered wires RL11, RL12, RL13 and RL14 through the third fixed resistors R15, R16, R17 and R18, respectively. In addition, the third testing circuit III is also connected with a ground terminal through a first ground resistor R19. The fourth testing circuit IV is connected with the output terminals OUT02, OUT04, OUT06 and OUT08 of the even-numbered wires RL21, RL22, RL23 and RL24 through the fourth fixed resistors R25, R26, R27 and R28, respectively. The fourth testing circuit IV is also connected with the ground terminal through a second ground resistor R29.

Consequently, the odd-numbered wires RL11, RL12, RL13 and RL14 are connected between the first testing circuit I and the third testing circuit III in parallel. The odd-numbered wire RL11 is connected with the first fixed resistor R11 and the third fixed resistor R15 in series. The odd-numbered wire RL12 is connected with the first fixed resistor R12 and the third fixed resistor R16 in series. The odd-numbered wire RL13 is connected with the first fixed resistor R13 and the third fixed resistor R17 in series. The odd-numbered wire RL14 is connected with the first fixed resistor R14 and the third fixed resistor R18 in series. Moreover, the even-numbered wires RL21, RL22, RL23 and RL24 are connected between the second testing circuit II and the fourth testing circuit IV in parallel. The even-numbered wire RL21 is connected with the second fixed resistor R21 and the fourth fixed resistor R25 in series. The even-numbered wire RL22 is connected with the second fixed resistor R22 and the fourth fixed resistor R26 in series. The even-numbered wire RL23 is connected with the second fixed resistor R23 and the fourth fixed resistor R27 in series. The even-numbered wire RL24 is connected with the second fixed resistor R24 and the fourth fixed resistor R28 in series.

Due to the arrangements of the first fixed resistors R11~R14, the second fixed resistors R21~R24, the third fixed resistors R15~R18 and the fourth fixed resistors R25~R28, the testing circuits are not in the short-circuited conditions. As mentioned above, the odd-numbered wires RL11, RL12, RL13 and RL14 are connected between the first testing circuit I and the third testing circuit III in parallel. If the first fixed resistors R11~R14 and the third fixed resistors R15~R18 are omitted and the resistance of the odd-numbered wire RL11 is much lower than the resistances of the odd-numbered wires RL12, RL13 and RL14, the current provided by the testing circuits may flow through the odd-numbered wire RL11 only. Under this circumstance, the testing circuits are in the short-circuited condition. Meanwhile, the control unit 11 generates an erroneous test result because of erroneous judgment. In other words, the arrangements of the first fixed resistors R11~R14, the second fixed resistors R21~R24, the third fixed resistors R15~R18 and the fourth fixed resistors R25~R28 are helpful to increase the stability of the testing circuits and the accuracy of the test results.

A first analog input pin AI4 of the voltage acquisition element 12 is connected with the third testing circuit III. A second analog input pin AI5 of the voltage acquisition element 12 is connected with the fourth testing circuit IV.

In the above embodiment, the first contact element 14 and the second contact element 15 are connected with the cable 21 having eight wires. It is noted that the number of the testing circuits included in the first contact element 14 and the second contact element 15 is not restricted. That is, the number of the testing circuits included in the first contact element 14 and the second contact element 15 is determined according to the number of the wires of the cable 21.

Please refer to FIG. 2 again. The control unit 11 is electrically connected with the voltage acquisition element 12. A digital output pin DO1 of the control unit 11 is connected with an optical relay 131 of the switch circuit 13 is connected with a single-pole-single-throw relay 132.

Figure 3A:
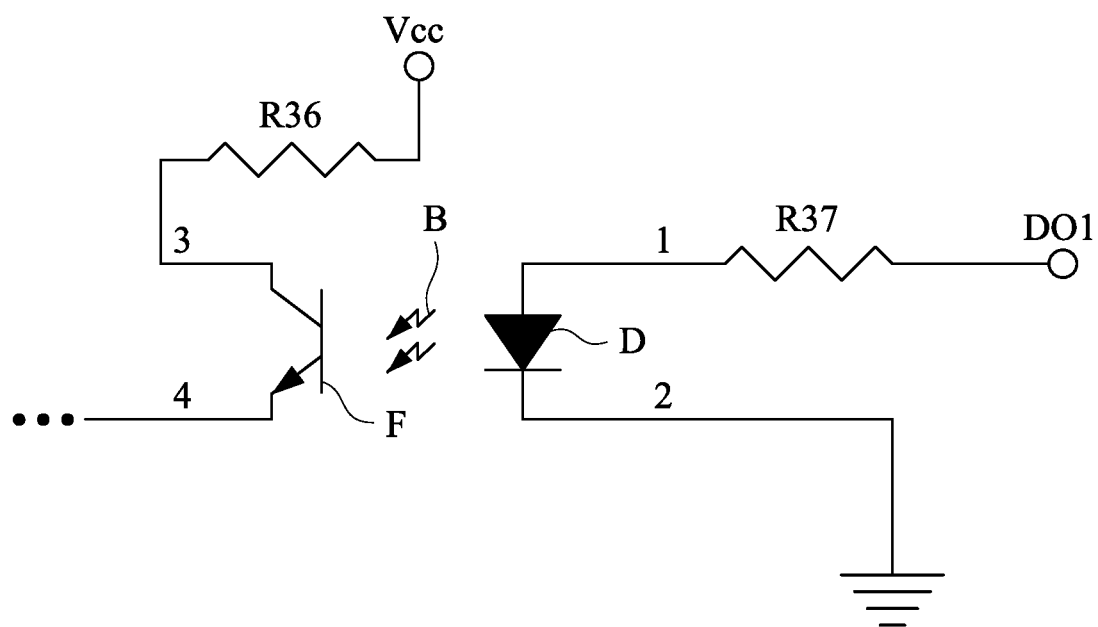
FIG. 3A is a schematic circuit diagram illustrating the optical relay of the circuit board testing system according to the embodiment of the present invention.
Figure 3B:
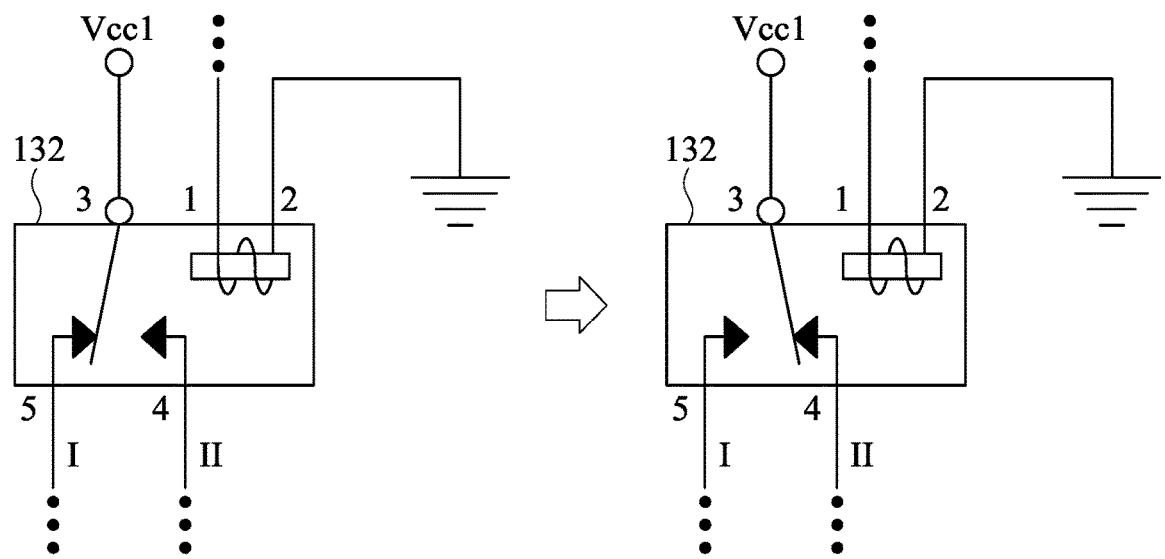
FIG. 3B is a schematic circuit diagram illustrating the operations of the single-pole-single-throw relay of the circuit board testing system according to the embodiment of the present invention.

Please refer to FIGS. 2, 3A and 3B. FIG. 3A is a schematic circuit diagram illustrating the optical relay of the circuit board testing system according to the embodiment of the present invention. FIG. 3B is a schematic circuit diagram illustrating the operations of the single-pole-single-throw relay of the circuit board testing system according to the embodiment of the present invention. As shown in FIG. 3A, the optical relay 131 comprises a light emitter D and a metal-oxide-semiconductor field-effect transistor F. A first input terminal of the light emitter D (i.e., the contact 1 as shown in FIG. 3A) is connected with the digital output pin DO1 of the control unit 11 (see FIG. 2) through a fixed resistor R37. A second input terminal of the light emitter D (i.e., the contact 2 as shown in FIG. 3A) is connected with the ground terminal A start voltage Vh (see FIG. 2) is outputted from the digital output pin DO1 of the control unit 11 to the light emitter D. In response to the start voltage Vh, the light emitter D emits and outputs a light beam B. A first output terminal of the metal-oxide-semiconductor field-effect transistor F (i.e. the contact 3 as shown in FIG. 3A) is connected with a DC power source Vcc through a fixed resistor R36. Moreover, a second output terminal of the metal-oxide-semiconductor field-effect transistor (i.e. the contact 4 as shown in FIG. 3A) is connected with a coil of the single-pole-single-throw relay 132 (see FIG. 2). When the light beam B is received by the metal-oxide-semiconductor field-effect transistor F, the metal-oxide-semiconductor field-effect transistor F is closed, and thus the optical relay 131 is enabled to drive the switching action of the single-pole-single-throw relay 132. In the above embodiment, the optical relay 131 is enabled to drive the switching action of the single-pole-single-throw relay 132. It is noted that numerous modifications and alterations may be made while retaining the teachings of the invention. For example, in another embodiment, the optical relay 131 is replaced by a Darlington transistor.

Please refer to FIG. 3B. A first terminal of the coil of the single-pole-single-throw relay 132 (e.g., the contact 1 as shown in FIG. 3B) is connected with the optical relay 131. A second terminal of the coil of the single-pole-single-throw relay 132 (e.g., the contact 2 as shown in FIG. 3B) is connected with the ground terminal. Moreover, the single-pole-single-throw relay 132 comprises a common terminal (e.g., the contact 3 as shown in FIG. 3B), a first normally closed terminal (i.e. the contact 5 as shown in FIG. 3B) and a second normally closed terminal (i.e. the contact 4 as shown in FIG. 3B). The common terminal is connected with a DC power source Vcc1. The DC power source Vcc1 provides a testing voltage Vt1. The first normally closed terminal is connected with the first testing circuit I. The second normally closed terminal is connected with the second testing circuit II. When the optical relay 131 is enabled to drive the switching action of the single-pole-single-throw relay 132, the connection between the common terminal and the first normally closed terminal of the single-pole-single-throw relay 132 is switched to the connection between the common terminal and the second normally closed terminal, or the connection between the common terminal and the second normally closed terminal of the single-pole-single-throw relay 132 is switched to the connection between the common terminal and the first normally closed terminal Consequently, the DC power source Vcc1 provides the testing voltage Vt1 to the first testing circuit I or the second testing circuit II through the first normally closed terminal or the second normally closed terminal.

Please refer to FIG. 2 again. The voltage acquisition element 12 acquires the voltage value T11 of the parallel-connected odd-numbered wires RL11~RL14 from the third testing circuit III through the first analog input pin AI4. Moreover, the voltage acquisition element 12 acquires the voltage value T21 of the parallel-connected even-numbered wires RL21~RL24 from the fourth testing circuit IV through the second analog input pin AI5. Moreover, the control unit 11 reads the voltage value T11 of the odd-numbered wires RL11~RL14 and the voltage value T21 of the even-numbered wires RL21~RL24 from the voltage acquisition element 12. According to the voltage values T11 and T21, the control unit 11 judges whether the wire function of the cable 21 is normal. The criteria of judging the wire function of the cable 21 are listed in Table 1.

TABLE 1

| | Voltage value T11 | Voltage value T21 | Test result |
|---|---|---|---|
| the common terminal is connected with the first normally closed terminal | In the rated range | 0 V | Normal (PASS) |
| | Not in the rated range | 0 V | Abnormal (FAIL) |
| | 0 V | 0 V | Opened (FAIL) |
| | >0 V | >0 V | Short-circuited (FAIL) |
| the common terminal is connected with the second normally closed terminal | 0 V | In the rated range | Normal (PASS) |
| | 0 V | Not in the rated range | Abnormal (FAIL) |
| | 0 V | 0 V | Opened (FAIL) |
| | >0 V | >0 V | Short-circuited (FAIL) |

Please refer to Table 1. In case that the connection between the common terminal and the first normally closed terminal of the single-pole-single-throw relay 132 is established, the DC power source Vcc1 provides the testing voltage Vt1 to the odd-numbered wires RL11~RL14 through the first testing circuit I. The voltage acquisition element 12 acquires the voltage value T11 of the odd-numbered wires RL11~RL14 and the voltage value T21 of the even-numbered wires RL21~RL24 through the first analog input pin AI4 and the second analog input pin AI5. Moreover, the control unit 11 reads the voltage values T11 and T21. If the voltage value T11 is maintained in the rated range and the voltage value T21 is 0V, the test result is normal (PASS). That is, the functions of the odd-numbered wires RL11~RL14 of the cable 21 are normal. If the voltage value T11 is not in the rated range and the voltage value T21 is 0V, the test result is abnormal (FAIL). That is, the functions of the odd-numbered wires RL11~RL14 of the cable 21 are abnormal because one of the odd-numbered wires RL11~RL14 is interrupted. If both of the voltage values T11 and T21 are 0V, the test result indicates that the cable 21 has an open-circuited problem (FAIL). That is, the odd-numbered wires RL11~RL14 of the cable 21 are erroneously in the open-circuited condition. Under this circumstance, the odd-numbered wires RL11~RL14 cannot be normally operated. If both of the voltage values T11 and T21 are higher than 0V, the test result indicates that the cable 21 has a short-circuited problem (FAIL). That is, there is a possible erroneous connection between the odd-numbered wires RL11~RL14 and the even-numbered wires RL21~RL24. Since the odd-numbered wires RL11~RL14 are in the short-circuited condition, a leakage current is generated.

Please refer to Table 1 again. In case that the connection between the common terminal and the second normally closed terminal of the single-pole-single-throw relay 132 is established, the DC power source Vcc1 provides the testing voltage Vt1 to the even-numbered wires RL21~RL24 through the second testing circuit II. Similarly, if the voltage value T21 is maintained in the rated range and the voltage value T11 is 0V, the test result is normal (PASS). That is, the functions of the even-numbered wires RL21~RL24 of the cable 21 are normal. If the voltage value T21 is not in the rated range and the voltage value T11 is 0V, the test result is abnormal (FAIL). That is, the functions of the even-numbered wires RL21~RL24 of the cable 21 are abnormal because one of the even-numbered wires RL21~RL24 is interrupted. If both of the voltage values T11 and T21 are 0V, the test result indicates that the cable 21 has an open-circuited problem (FAIL). That is, the even-numbered wires RL21~RL24 of the cable 21 are erroneously in the open-circuited condition. Under this circumstance, the even-numbered wires RL21~RL24 cannot be normally operated. If both of the voltage values T11 and T21 are higher than 0V, the test result indicates that the cable 21 has a short-circuited problem (FAIL). That is, there is a possible erroneous connection between the even-numbered wires RL21~RL24 and the odd-numbered wires RL11~RL14. Since the even-numbered wires RL21~RL24 are in the short-circuited condition, a leakage current is generated.

Please refer to FIG. 2 again. The LED module 22 is connected with a DC power source VCC2. The DC power source VCC2 provides a testing voltage Vt2 to plural LED elements D1, D2, D3 and D4 of the LED module 22. The third contact element 16 is connected with the plural LED elements D1, D2, D3 and D4 of the LED module 22. The third contact element 16 is also connected with plural third ground resistors R1, R2, R3 and R4 corresponding to the LED elements D1, D2, D3 and D4, respectively. When the third contact element 16 is connected with the plural LED elements D1, D2, D3 and D4, the LED element D1 is serially connected with the third ground resistor R1 and connected to the ground terminal, the LED element D2 is serially connected with the third ground resistor R2 and connected to the ground terminal, the LED element D3 is serially connected with the third ground resistor R3 and connected to the ground terminal, and the LED element D4 is serially connected with the third ground resistor R4 and connected to the ground terminal.

Moreover, plural third analog input pins AI0, AI1, AI2 and AI3 of the voltage acquisition element 12 are connected to the nodes between the LED elements D1~D4 and the third ground resistors R1~R4, respectively. Consequently, the voltage acquisition element 12 acquires the voltage values T1, T2, T3 and T4 of the LED elements D1, D2, D3 and D4 from the third contact element 16 through the third analog input pins AI0, AI1, AI2 and AI3, respectively. The control unit 11 reads the voltage values T1, T2, T3 and T4 of the LED elements D1~D4 from the voltage acquisition element 12 and judges whether the function of the LED module 22 is normal according to the voltage values T1, T2, T3 and T4.

In the above embodiment, the third contact element 16 is connected with the LED module 22 having four LED elements. It is noted that the number of the testing circuits included in the third contact element 16 is not restricted. That is, the number of the testing circuits included in the third contact element 16 is determined according to the number of the LED elements.

When compared with the conventional technology, the circuit board testing system of the present invention is capable of accurately and quickly testing the cable wires of the circuit board and the LED elements. Since it is not necessary to manually test the wires of the cable in the one-by-one manner, the process of testing the cable wires of the circuit board is labor-saving and time-saving and the production efficiency in the production line is increased. In other words, the circuit board testing system of the present invention is industrially valuable.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. A circuit board testing system comprising a testing fixture, the testing fixture being connected with a circuit board for testing plural wires of a cable of the circuit board, the testing fixture comprising:
a first contact element connected with input terminals of odd-numbered wires of the plural wires and input terminals of even-numbered wires of the plural wires;
a switch circuit connected with the first contact element, and providing a testing voltage to the first contact element;
a second contact element connected with output terminals of the odd-numbered wires and output terminals of the even-numbered wires;
a voltage acquisition element connected with the second contact element, and acquiring voltage values of the plural wires; and
a control unit connected with the voltage acquisition element and the switch circuit, and reading the voltage values of the plural wires from the voltage acquisition element,
wherein when the control unit drives a switching action of the switch circuit, the testing voltage is provided to the odd-numbered wires or the even-numbered wires, and the control unit reads the voltage values of the odd-numbered wires and the voltage values of the even-numbered wires from the voltage acquisition element, wherein the control unit judges whether functions of the plural wires of the cable are normal according to the voltage values of the odd-numbered wires and the voltage values of the even-numbered wires.

2. The circuit board testing system according to claim 1, wherein the first contact element comprises a first testing circuit and a second testing circuit, and the second contact element comprises a third testing circuit and a fourth testing circuit.

3. The circuit board testing system according to claim 2, wherein the first testing circuit is connected with the input terminals of the odd-numbered wires through plural first fixed resistors.

4. The circuit board testing system according to claim 2, wherein the second testing circuit is connected with the input terminals of the even-numbered wires through plural third fixed resistors.

5. The circuit board testing system according to claim 2, wherein the third testing circuit is connected with the output terminals of the odd-numbered wires through plural third fixed resistors and connected to a ground terminal through a first ground resistor.

6. The circuit board testing system according to claim 2, wherein the fourth testing circuit is connected with the output terminals of the even-numbered wires through plural fourth fixed resistors and connected to a ground terminal through a second ground resistor.

7. The circuit board testing system according to claim 2, wherein the odd-numbered wires are connected between the first testing circuit and the third first testing circuit in parallel.

8. The circuit board testing system according to claim 7, wherein the voltage acquisition element comprises a first analog input pin, and the first analog input pin is connected with the third testing circuit to acquire the voltage values of the odd-numbered wires.

9. The circuit board testing system according to claim 2, wherein the even-numbered wires are connected between the second testing circuit and the fourth first testing circuit in parallel.

10. The circuit board testing system according to claim 9, wherein the voltage acquisition element comprises a second analog input pin, and the second analog input pin is connected with the fourth testing circuit to acquire the voltage values of the even-numbered wires.

11. The circuit board testing system according to claim 2, wherein the switch circuit comprises an optical relay and a single-pole-single-throw relay, wherein the single-pole-single-throw relay is connected with the optical relay and comprises a common terminal, a first normally closed terminal and a second normally closed terminal, wherein the common terminal is connected with a DC power source, the DC power source provides the testing voltage, the first normally closed terminal is connected with the first testing circuit, and the second normally closed terminal is connected with the second testing circuit.

12. The circuit board testing system according to claim 11, wherein the control unit comprises a digital output pin, and the digital output pin is connected with the optical relay to provide a start voltage to the optical relay, wherein in response to the start voltage, the optical relay is enabled to drive the common terminal of the single-pole-single-throw relay to be connected with the first normally closed terminal or the second normally closed terminal.

13. The circuit board testing system according to claim 1, wherein the testing fixture further comprises a third contact element, and the third contact element is connected with plural LED elements of the circuit board.

14. The circuit board testing system according to claim 13, wherein the third contact element is connected with plural third ground resistors, wherein the plural LED elements are serially connected with the corresponding third ground resistors and connected with a ground terminal.

15. The circuit board testing system according to claim 14, wherein the voltage acquisition element comprises plural third analog input pins, and the plural third analog input pins are connected between the corresponding LED elements and the corresponding third ground resistors so as to acquire voltage values of the LED elements.

16. The circuit board testing system according to claim 15, wherein the control unit reads the voltage values of the corresponding LED elements from the voltage acquisition element.

* * * * *